US006303435B1

(12) United States Patent
Chern

(10) Patent No.: US 6,303,435 B1
(45) Date of Patent: Oct. 16, 2001

(54) METHOD OF FABRICATING A WIDE-BASED BOX-STRUCTURED CAPACITOR CONTAINING HEMI-SPHERICAL GRAINS

(75) Inventor: Horng-Nan Chern, Tainan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/531,992

(22) Filed: Mar. 20, 2000

(30) Foreign Application Priority Data

Mar. 6, 2000 (TW) .............................................. 089103946

(51) Int. Cl.$^7$ ................................................ H01L 21/8242
(52) U.S. Cl. ........................ 438/255; 438/255; 438/398; 438/713; 438/673; 438/701; 438/665; 438/964
(58) Field of Search .................................... 438/253–256, 438/396–399, 713, 673, 701, 665, 964

(56) References Cited

U.S. PATENT DOCUMENTS

| | | | |
|---|---|---|---|
| 5,316,616 | * | 5/1994 | Nakamura et al. .................. 156/643 |
| 5,515,984 | * | 5/1996 | Yokayama et al. ..................... 216/41 |
| 5,707,487 | * | 1/1998 | Hori et al. ........................ 156/659.11 |
| 5,792,691 | * | 8/1998 | Koga ..................................... 438/233 |
| 5,858,837 | * | 1/1999 | Sakoh et al. ........................... 438/255 |
| 6,013,549 | * | 1/2000 | Han et al. ............................. 438/253 |
| 6,124,161 | * | 9/2000 | Chern et al. .......................... 438/238 |
| 6,177,326 | * | 1/2001 | Wu et al. .............................. 438/396 |
| 6,204,191 | * | 3/2001 | Jung et al. ............................ 438/713 |

* cited by examiner

*Primary Examiner*—John F. Niebling
*Assistant Examiner*—Jennifer M. Kennedy
(74) *Attorney, Agent, or Firm*—Jiawei Huang; J.C. Patents

(57) ABSTRACT

A method of fabricating a wide-based boxed-structured capacitor containing hemi-spherical silicon grains. A substrate is provided with a source/drain and a first dielectric layer is formed on the substrate with a node contact opening. Then a doped polysilicon layer and a doped amorphous silicon layer are formed sequentially on the first dielectric layer. An etching step is performed to etch the doped amorphous silicon layer and the doped polysilicon layer and a wide-based lower electrode is formed by adjusting flow speeds of chlorine and of hydrogen bromide. Hemi-spherical silicon grains are formed on the surface of the doped amorphous silicon layer in the lower electrode. A second dielectric layer and an upper electrode are formed sequentially on the lower electrode and the capacitor is completed.

14 Claims, 2 Drawing Sheets

METHOD OF FABRICATING A WIDE-BASED BOX-STRUCTURED CAPACITOR CONTAINING HEMI-SPHERICAL GRAINS

CROSS-REFERENCE TO RELATED APPLICATION

This application claims the priority benefit of Taiwan application serial no. 89103946, filed Mar. 6, 2000.

BACKGROUND OF THE INVENTION

1. Field of Invention

The present invention relates to a method of fabricating a semiconductor memory capacitor. More particularly, the present invention relates to a method of fabricating a wide-based box-structured capacitor containing hemi-spherical grains.

2. Description of Related Art

When semiconductor manufacture moves into the deep sub-micron process, the device size becomes smaller and the available space for capacitors decreases. In contrast, as the application software increases in size, the required storage capacity of the capacitor needs to be larger. Consequently, the method for fabricating the capacitor in a dynamic random access memory (DRAM) device has to be changed, in order to be compatible with the market requirement for smaller device size and larger memory size.

The capacitor is the heart for storing information in the DRAM device. As long as the capacitor stores more charges, less damaging influences are induced by noise, for example, soft errors, which are caused by α particles, can be greatly reduced during information reading; furthermore, the frequency for refresh can be reduced as well.

The storage capacity of the conventional DRAM device is small because a two-dimensional capacitor, that is, a planar type capacitor, is used in the integrated circuit manufacture process. The planar type capacitor takes quite large areas of a semiconductor substrate to store charges; therefore, it is not suitable for the design of high-integration devices. Three-dimensional capacitors are used for high-integration DRAM devices.

However, simple structures of three-dimensional capacitors nowadays can no longer satisfy the need for the memory device of higher integration. Therefore, methods for increasing surface areas of DRAM capacitors within small available spaces for capacitors have been developed. Variant structures have been used for capacitors to increase the storage capacity of the memory device, such as stacked types and trench types. Stacked type structures includes double-stacked type, fin-structured type, cylindrical type, spread-stacked type and box-structured type structures.

It is an important task for capacitors to maintain enough storage capacity in processes of semiconductor manufacture below 0.25 μm. One way of increasing the storage capacity for capacitors is to increase the surface areas of capacitors. Taking crown-structured capacitors for example, hemi-spherical grains (HSG) are formed on the surfaces of lower electrodes of the crown-structured capacitors to increase the storage capacity of capacitors in processes of semiconductor manufacture below 0.18 μm.

FIG. 1A to FIG. 1C are schematic, cross-sectional views illustrating the process steps of fabricating a lower electrode of a box-structured DRAM capacitor according to the prior art. Referring to FIG. 1A, source/drains 102 are formed in a substrate 100. A silicon oxide layer 104 is deposited on substrate 100, and then node contact openings 106 are formed by photolithography and etching. A doped amorphous silicon layer 110 is deposited on substrate 100 and inside openings 106 by low-pressure chemical vapor deposition (LPCVD) at about 530 degrees Centigrade.

Referring to FIG. 1B, amorphous silicon layer 110 is defined to form lower electrodes 110a.

Referring to FIG. 1C, hemi-spherical silicon grains (HSG-Si) 112 are grown on the surfaces of lower electrodes 110a, and lower electrodes 110b with larger surface areas are formed thereon. Because of the requirement for high integration, the areas for forming capacitors are limited. Within these available areas, if a distance 114 between two adjacent electrodes is too short, hemi-spherical silicon grains 112 on the surfaces of adjacent electrodes 110b contact each other and induce short circuits. On the contrary, if distance 114 is too long, then lower electrodes 110b fall down due to overly thin bases.

SUMMARY OF THE INVENTION

The invention provides a method of fabricating a wide-based box-structured capacitor containing hemi-spherical grains, so that the lower electrodes are not so thin that they fall down. Furthermore, it increases integration for capacitors but cause no more short circuits problems.

As embodied and broadly described herein, a substrate is provided with a source/drain and a first dielectric layer is formed on the substrate with a node contact opening that exposes the source/drain. Then a doped polysilicon layer and a doped amorphous silicon layer are formed sequentially on the first dielectric layer. A first etching step is performed to etch the doped amorphous silicon layer and the doped polysilicon layer until the first dielectric layer is exposed and a lower electrode is formed thereon in the node contact opening and on the surrounding first dielectric layer. The first etching step comprises the usage of a first flow speed for chlorine and a second flow speed for hydrogen bromide. A second etching step is performed on the lower electrode with a third flow speed of chlorine and a fourth flow speed of hydrogen bromide. The first flow speed is higher than the third flow speed and the second flow speed is lower than the fourth flow speed. A wide-based lower electrode is formed by adjusting flow speeds of chlorine and of hydrogen bromide and duration of the second etching step. Hemi-spherical silicon grains are formed on the surface of the doped amorphous silicon layer in the lower electrode. A second dielectric layer and an upper electrode are formed sequentially on the lower electrode and the capacitor is completed.

As embodied and broadly described herein, hemi-spherical silicon grains only can grow on the surface of the doped amorphous silicon layer, but not on the surface of the doped polysilicon layer that is formed before the formation of the doped amorphous silicon layer. Therefore, the growth of hemi-spherical silicon grains does not cause bridging between adjacent lower electrodes, nor induce short circuits in the capacitors. Moreover, the bases of the lower electrodes are wider than the tops of the lower electrodes, so that the lower electrodes do not easily fall down.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
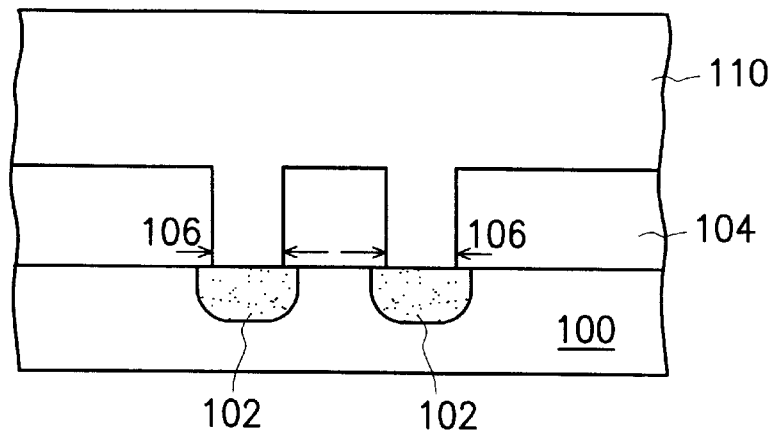
FIG. 1A to FIG. 1C are schematic, cross-sectional views illustrating the process steps of fabricating a lower electrode of a box-structured DRAM capacitor according to the prior art.
Figure 1B:
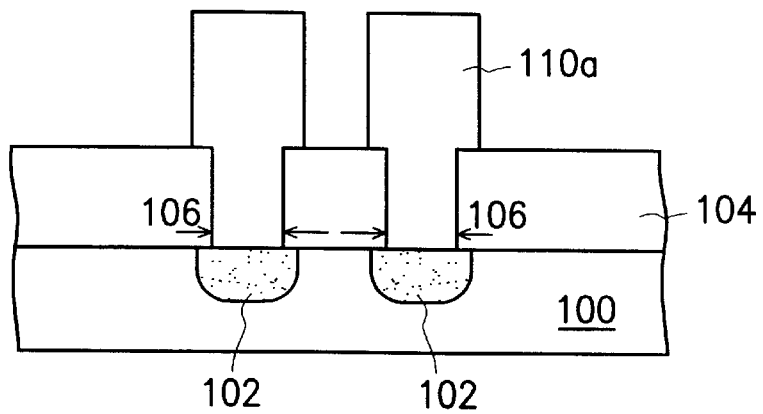
Figure 1C:
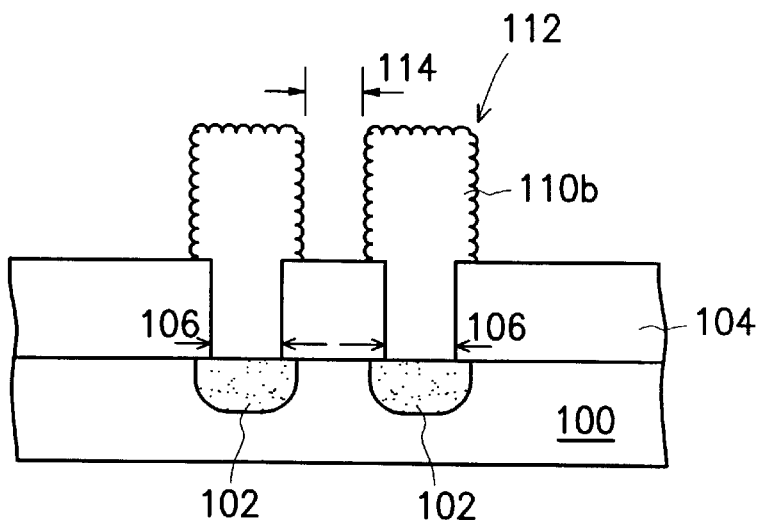
Figure 2A:
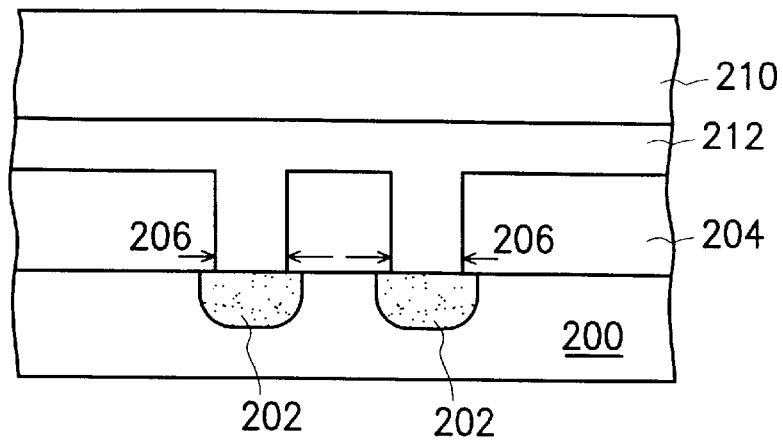
FIG. 2A to FIG. 2C are schematic, cross-sectional views illustrating the process steps of fabricating a lower electrode of a wide-based box-structured capacitor according to one preferred embodiment of this invention.

Referring to FIG. 2A, source/drains 202 are formed by, for example, ion implantation, in a substrate 200. A dielectric layer 204 is then formed on substrate 200. A material of dielectric layer 204 can be, for example, silicon oxide, formed by, for example, low pressure chemical vapor deposition while using $Si(OC_2H_5)_4$ as a gas source. Node contact openings 206 are formed in dielectric layer 204 by processes that comprise photolithography and etching.

A doped polysilicon layer 212 is deposited by, for example, chemical vapor deposition, over dielectric layer 204 and node contact openings 206. Dopants for doped polysilicon layer 212 can be doped, for example, during deposition, in an in situ doping process, or by ion implantation after deposition. A doped amorphous silicon layer 210 is formed by, for example, low pressure chemical vapor deposition, on doped polysilicon layer 212.

Figure 2B:
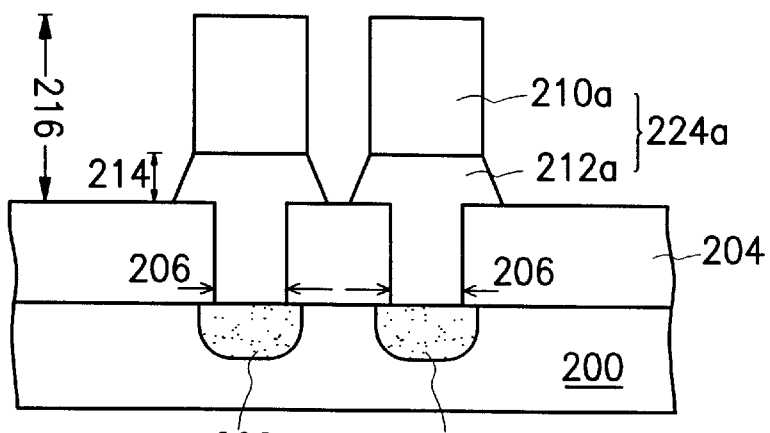

Referring to FIG. 2B, a first etching step is performed to remove part of doped amorphous silicon layer 210 and part of doped polysilicon layer 212, which is above dielectric layer 204, resulting in doped amorphous silicon layer 210a and doped polysilicon layer 212a. Lower electrodes 224a are formed thereon with the bases wider than the tops. A second etching step is then performed to prevent bridging between adjacent lower electrodes 224a because the adjacent distances are too short.

The first etching step and the second etching step can be achieved by, for example, adjusting flow speeds of chlorine and hydrogen bromide in reactive ion etching to obtain inclines for lower electrodes 224a, so that the bases are wider than the tops in lower electrodes 224a.

In general, the degree of slope for inclines in lower electrodes 224a increases as the flow speed of hydrogen bromide increases. It is because the ions produced by hydrogen bromide react with the silicon from doped amorphous silicon layer 210a and doped polysilicon layer 212a to form $SiBr_xH_y$, and $SiBr_xH_y$ is deposited on the inclines of lower electrodes 224a and decreases etching rates for the inclines. Additionally, as a flow volume of chlorine increases, or etching duration for the second etching step is extended, the degree of slope for inclines in lower electrodes 224a decreases, which means lower electrodes 224a are more vertical.

Preferable operation conditions for the first etching step comprise a pressure range for the reaction chamber of about 12 to about 18 militorrs, a power range for the RF source of about 400 to about 500 Watts, a flow speed for chlorine of about 60 to about 80 sccm (standard cubic centimeter per minute), and a flow speed for hydrogen bromide of about 100 to about 150 sccm. Preferable operation conditions for the second etching step comprise a pressure range for the reaction chamber of about 35 to about 45 militorrs, a power range for the RF source of about 350 to about 450 Watts, a flow speed for chlorine of about 35 to about 45 sccm, and a flow speed for hydrogen bromide of about 200 to about 300 sccm.

For the first etching step and the second etching step, if etching duration for the second etching step is about 1 to about 50 seconds, then lower electrodes 224a with wide bases are formed. However, if the etching duration of the second etching step is longer, for example, 80 seconds, then the inclines of lower electrodes 224a become more vertical.

Furthermore, a height difference 214 between doped polysilicon layer 212a and dielectric layer 204 is less than a fourth of a height difference 216 between lower electrode 224a and dielectric layer 204.

Figure 2C:
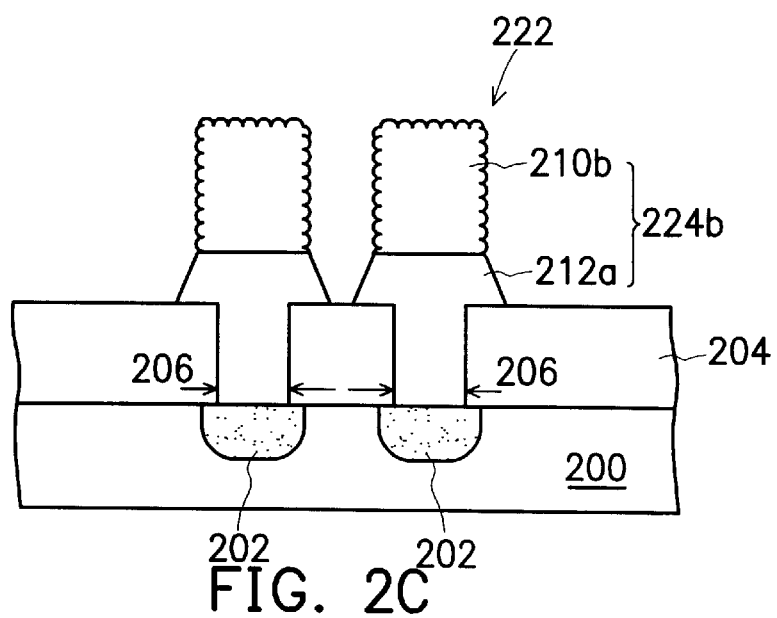

Referring to FIG. 2C, after a seeding step and a high vacuum annealing step at about 550 to about 590 degrees Centigrade are performed, hemi-spherical silicon grains 222 are formed on the surfaces of doped amorphous layer 210b in lower electrodes 224a. A gas source for seeding comprises silicane or $Si_2H_6$ with a preferred flow speed of less than about 40 sccm.

Afterwards, a dielectric layer (not shown) and upper electrodes (not shown) are formed on lower electrodes 224b, and the structures of the DRAM capacitors are completed. The processes are not described here since they are well known to persons familiar with the prior art.

As embodied and described broadly herein, this invention has at least the following advantages:

1. Hemi-spherical silicon grains can only grow on the surface of the doped amorphous silicon layer, and not on the surface of the doped polysilicon layer formed before the doped amorphous silicon layer is formed. Therefore, the growth of hemi-spherical silicon grains does not cause bridging between adjacent lower electrodes, nor induces short circuits in the capacitors.

2. By controlling the flow speeds of the etching gases and the etching duration for the second etching step, wide-based lower electrodes are formed to support the narrower tops of lower electrodes, so that the lower electrodes do not fall down.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a wide-based, box-structured capacitor containing hemi-spherical grains, wherein a substrate is provided with a source/drain and a first dielectric layer is formed on the substrate with a node contact opening that exposes the source/drain, the method comprising:

forming a doped polysilicon layer on the substrate;

forming a doped amorphous silicon layer on the doped polysilicon layer;

performing a first etching step, wherein a first flow speed of chlorine and a second flow speed of hydrogen bromide are used to etch the doped amorphous silicon layer and the doped polysilicon layer until the first dielectric layer is exposed and a lower electrode is formed thereon in the node contact opening and on the surrounding first dielectric layer;

performing a second etching step on the lower electrode, wherein a third flow speed of chlorine and a fourth flow speed of hydrogen bromide are used, and the first flow speed is higher than the third flow speed and the second flow speed is lower than the fourth flow speed;

forming hemi-spherical silicon grains on a surface of the doped amorphous silicon layer in the lower electrode;

forming a second dielectric layer on a surface of the lower electrode; and forming an upper electrode on the second dielectric layer.

2. The method as claimed in claim 1, wherein the step of forming the doped polysilicon layer comprises chemical vapor deposition.

3. The method as claimed in claim 1, wherein the step of forming the doped amorphous silicon layer comprises chemical vapor deposition.

4. The method as claimed in claim 1, wherein both the first etching step and the second etching step comprise anisotropical etching.

5. The method as claimed in claim 1, wherein reaction parameters for the first etching step comprise:

a pressure range for the reaction chamber of about 12 to about 18 militorrs;

a power range for a RF source of about 400 to about 500 Watts;

a flow speed for chlorine of about 60 to about 80 sccm (standard cubic centimeter per minute); and a flow speed for hydrogen bromide of about 100 to about 150 sccm.

6. The method as claimed in claim 1, wherein reaction parameters for the second etching step comprise:

a pressure range for the reaction chamber of about 35 to about 45 militorrs;

a power range for a RF source of about 350 to about 450 Watts;

a flow speed for chlorine of about 35 to about 45 sccm; and a flow speed for hydrogen bromide of about 200 to about 300 sccm.

7. The method as claimed in claim 6, wherein etching duration for the second etching step is about 1–50 seconds.

8. The method as claimed in claim 1, wherein a height difference between the doped polysilicon layer and the first dielectric layer is less than a fourth of a height difference between the lower electrode and the first dielectric layer.

9. The method as claimed in claim 1, wherein the step for forming hemi-spherical silicon grains on the surface of the doped amorphous silicon layer comprises:

seeding the doped amorphous silicon layer; and performing a high vacuum annealing step.

10. A method of fabricating a wide-based, box-structured capacitor containing hemi-spherical grains, wherein a substrate is provided with a source/drain and a dielectric layer is formed on the substrate with a node contact opening that exposes the source/drain, the method comprising:

forming a doped polysilicon layer on the substrate;

forming a doped amorphous silicon layer on the doped polysilicon layer;

performing an etching step, wherein flow speeds of chlorine and of hydrogen bromide are adjusted to etch the doped amorphous silicon layer and the doped polysilicon layer and a wide-based lower electrode is formed thereon in the node contact opening and on the surrounding first dielectric layer; and forming hemi-spherical silicon grains on a surface of the doped amorphous silicon layer in the lower electrode.

11. The method as claimed in claim 10, wherein the etching step comprises a first etching step that includes flow speeds for chlorine and hydrogen bromide of about 60–80 sccm and of about 100–150 sccm, respectively, and a second etching step that includes flow speeds for chlorine and hydrogen bromide of about 35–45 sccm and of about 200–300 sccm, respectively.

12. The method as claimed in claim 10, wherein the first etching step is performed with a reaction chamber pressure of about 12–18 militorrs and a power for a RF source of about 400–500 Watts, while using the dielectric layer as the stop layer.

13. The method as claimed in claim 10, wherein the second etching step is performed with a reaction chamber pressure of about 35–45 militorrs, a power for a RF source of about 350–450 Watts and a duration of about 1–50 seconds.

14. The method as claimed in claim 10, wherein a height difference between the doped polysilicon layer and the dielectric layer is less than a fourth of a height difference between the lower electrode and the dielectric layer.

* * * * *